(12) United States Patent
Kuroiwa et al.

(10) Patent No.: US 9,039,915 B2
(45) Date of Patent: May 26, 2015

(54) ETCHING SOLUTION COMPOSITIONS FOR METAL LAMINATE FILMS

(75) Inventors: Kenji Kuroiwa, Soka (JP); Kazuaki Nagashima, Soka (JP); Masaru Kato, Soka (JP); Masahiro Nohara, Osaka (JP)

(73) Assignee: Kanto Kagaku Kabushiki Kaisha, Tokyo (JP)

( * ) Notice: Subject to any disclaimer, the term of this patent is extended or adjusted under 35 U.S.C. 154(b) by 288 days.

(21) Appl. No.: 13/201,955

(22) PCT Filed: Feb. 23, 2010

(86) PCT No.: PCT/JP2010/052662
§ 371 (c)(1),
(2), (4) Date: Aug. 17, 2011

(87) PCT Pub. No.: WO2010/095742
PCT Pub. Date: Aug. 26, 2010

(65) Prior Publication Data
US 2011/0297873 A1 Dec. 8, 2011

(30) Foreign Application Priority Data
Feb. 23, 2009 (JP) ................. 2009-039116

(51) Int. Cl.
*C03C 25/68* (2006.01)
*C23F 1/20* (2006.01)
*C23F 1/26* (2006.01)
*C23F 1/44* (2006.01)
*H01L 21/3213* (2006.01)

(52) U.S. Cl.
CPC ... *C23F 1/20* (2013.01); *C23F 1/26* (2013.01); *C23F 1/44* (2013.01); *H01L 21/32134* (2013.01)

(58) Field of Classification Search
CPC ............... C23F 1/20; C23F 1/26; C23F 1/44; H01L 21/32134
USPC ........................ 216/95, 102, 103, 104, 109
See application file for complete search history.

(56) References Cited

U.S. PATENT DOCUMENTS

| | | | |
|---|---|---|---|
| 5,300,813 A * | 4/1994 | Joshi et al. ................... 257/752 |
| 5,462,891 A | 10/1995 | Okada |
| 5,895,563 A * | 4/1999 | Muranushi ................... 205/210 |
| 6,679,952 B2 * | 1/2004 | Shimizu et al. .............. 148/247 |
| 2003/0103116 A1* | 6/2003 | Sugahara et al. .............. 347/71 |
| 2005/0194564 A1 | 9/2005 | Fujita et al. |
| 2008/0149885 A1 | 6/2008 | Lin et al. |
| 2008/0224092 A1 | 9/2008 | Choung et al. |
| 2008/0286974 A1* | 11/2008 | Kim et al. ..................... 438/702 |
| 2010/0193465 A1 | 8/2010 | Hori et al. |

FOREIGN PATENT DOCUMENTS

| CN | 101130870 A | 2/2008 |
|---|---|---|
| CN | 101205614 A | 6/2008 |
| CN | 101265579 A | 9/2008 |
| JP | 59-124726 A | 7/1984 |
| JP | 5-291863 A | 5/1993 |
| JP | 6-310492 A | 11/1994 |
| JP | 9-3662 A | 1/1997 |
| JP | 2005-232559 A | 9/2005 |
| JP | 2007-067367 A | 3/2007 |
| JP | 2007-075690 A | 3/2007 |
| JP | 2008-053374 A | 3/2008 |
| JP | 2008-227508 A | 9/2008 |

* cited by examiner

Primary Examiner — Binh X Tran
(74) Attorney, Agent, or Firm — Wolf, Greenfield & Sacks, P.C.

(57) ABSTRACT

Disclosed are etching solution compositions that comprise fluorine compounds and iron ions, which are used for bulk etching of metal laminate films wherein a layer comprising aluminum or an aluminum alloy is laminated on top and a layer comprising titanium or a titanium alloy on bottom, and an etching method using said etching solution compositions.

8 Claims, No Drawings

US 9,039,915 B2

ETCHING SOLUTION COMPOSITIONS FOR METAL LAMINATE FILMS

RELATED APPLICATION

This application is a national stage filing under 35 U.S.C. §371 of PCT International application PCT/JP2010/052662, filed Feb. 23, 2010.

TECHNICAL FIELD

The present invention relates to an etching solution composition for a metal laminate film used in formation of gate, source, and drain electrodes of a liquid crystal display.

BACKGROUND ART

Aluminum and an alloy in which aluminum has added to it an impurity such as neodymium, silicon, or copper are inexpensive and have low resistance, and are therefore used as gate, source, and drain electrode materials for a liquid crystal display.

However, since aluminum and the aluminum alloy have somewhat poor adhesion to a glass substrate base, they are used as an electrode material in the form of a laminate film in which a molybdenum or molybdenum alloy film is used beneath the aluminum or aluminum alloy, and one-time etching is carried out by means of an etching solution employing phosphoric acid, etc.

In recent years, the price of molybdenum or a molybdenum alloy has been increasing steeply, and titanium or a titanium alloy has therefore received attention. However, it is impossible to carry out etching of titanium or a titanium alloy by means of the etching solution employing phosphoric acid, etc. that is used in aluminum/molybdenum laminate film etching.

It is known that when etching titanium or a titanium alloy in a process for fabricating a semiconductor device, a hydrofluoric acid-based etching solution is normally used (e.g. Patent Document 1). Furthermore, it is also known that a metal thin film containing titanium as a main component can be etched using an ammonia+hydrogen peroxide-based etching solution (e.g. Patent Document 2). Moreover, when etching a titanium/aluminum/titanium laminate film, an etching solution formed from a fluorine compound and an oxidizing agent has been reported (Patent Document 3).

However, when a hydrofluoric acid-based etching solution is used for etching of an aluminum/titanium laminate film, since the amount of the upper aluminum layer etched greatly exceeds the amount of the lower titanium layer etched, side etching increases, and there is the problem that wiring cannot be formed exactly as in a resist pattern. This also applies to a case in which an etching solution consisted of a fluorine compound and an oxidizing agent is used for etching of an aluminum/titanium laminate film; when the uppermost layer film is aluminum the susceptibility to a liquid reagent is higher than in the case when the uppermost layer film is titanium, and it becomes difficult to carry out a high precision etching treatment. With regard to the ammonia+hydrogen peroxide-based etching solution, since the etching rate for aluminum or titanium is very low and the stability of hydrogen peroxide is decreased when solution is basic, thus shortening the solution life, it cannot be said to be practical.

As described above, means suitable for one-time etching of a metal laminate film in which a layer formed from aluminum or an aluminum alloy as an upper part and a layer formed from titanium or a titanium alloy as a lower part are laminated has not yet been developed.

PRIOR ART DOCUMENTS

Patent Documents

Patent Document 1: JP, A, 59-124726
Patent Document 2: JP, A, 6-310492
Patent Document 3: JP, A, 2007-67367
Patent Document 4: JP, A, 5-291863
Patent Document 5: JP, A, 9-3662
Patent Document 6: JP, A, 2007-75690

SUMMARY OF THE INVENTION

Problems to be Solved by the Invention

It is an object of the present invention to provide an etching solution composition that can suppress side etching and give a good cross-sectional shape when etching a metal laminate film in which a layer formed from aluminum or an aluminum alloy as an upper part and a layer formed from titanium or a titanium alloy as a lower part are laminated, and a method for one-time etching such a metal laminate film.

Means for Solving the Problems

While carrying out an intensive investigation in order to solve the above-mentioned problems, the present inventors have discovered that by the addition of a small amount of iron ion to an etching solution containing a fluorine compound, the amount of side etching of an aluminum/titanium laminate film can be greatly reduced, and the present invention has thus been accomplished.

That is, the present invention relates to an etching solution composition containing a fluorine compound and an iron ion, the etching solution composition being used for one-time etching of a metal laminate film in which a layer formed from aluminum or an aluminum alloy as an upper part and a layer formed from titanium or a titanium alloy as a lower part are laminated.

The present invention also relates to the etching solution composition further containing one or more acids selected from the group consisting of nitric acid, hydrochloric acid, perchloric acid, and methanesulfonic acid.

The present invention further relates to the etching solution composition further containing phosphorous acid and/or phosphoric acid.

The present invention further relates to the etching solution composition, wherein it has a pH of no greater than 2.

Furthermore, the present invention relates to the etching solution composition, containing a fluorine compound at a concentration of 0.01 to 0.5 mol/L and an iron ion at 0.0001 to 0.05 mol/L.

Moreover, the present invention relates to the etching solution composition, containing one or more types selected from the group consisting of nitric acid, hydrochloric acid, perchloric acid, and methanesulfonic acid at a total concentration of 0.01 to 1.0 mol/L.

Moreover, the present invention relates to the etching solution composition, containing phosphorous acid and/or phosphoric acid at a total concentration of 0.001 to 0.1 mol/L.

The present invention also relates to an etching solution composition containing hydrofluoric acid at a concentration of 0.01 to 0.5 mol/L, trivalent iron ion at 0.0001 to 0.05 mol/L, nitric acid at 0.01 to 1.0 mol/L, and phosphorous acid at 0.001 to 0.1 mol/L, the etching solution composition being used for one-time etching of a metal laminate film in which a layer formed from aluminum or an aluminum alloy as an upper part and a layer formed from titanium or a titanium alloy as a lower part are laminated.

The present invention further relates to a method for one-time etching a metal laminate film in which a layer formed from aluminum or an aluminum alloy as an upper part and a layer formed from titanium or a titanium alloy as a lower part are laminated, the method using an etching solution composition containing a fluorine compound and an iron ion.

The present invention yet further relates to the method, wherein the etching solution composition further contains one or more types selected from the group consisting of nitric acid, hydrochloric acid, perchloric acid, and methanesulfonic acid.

Furthermore, the present invention relates to the method, wherein the etching solution composition further contains phosphorous acid and/or phosphoric acid.

Moreover, the present invention relates to the method, wherein the etching solution composition has a pH of no greater than 2.

Furthermore, the present invention relates to the method, wherein the etching solution composition contains a fluorine compound at a concentration of 0.01 to 0.5 mol/L and an iron ion at 0.0001 to 0.05 mol/L.

The present invention also relates to the method, wherein the etching solution composition contains one or more types selected from the group consisting of nitric acid, hydrochloric acid, perchloric acid, and methanesulfonic acid at a total concentration of 0.01 to 1.0 mol/L.

The present invention further relates to the method, wherein the etching solution composition contains phosphorous acid and/or phosphoric acid at a total concentration of 0.001 to 0.1 mol/L.

The present invention yet further relates to a method for one-time etching a metal laminate film in which a layer formed from aluminum or an aluminum alloy as an upper part and a layer formed from titanium or a titanium alloy as a lower part are laminated, the method using an etching solution composition containing hydrofluoric acid at a concentration of 0.01 to 0.5 mol/L, trivalent iron ion at 0.0001 to 0.05 mol/L, nitric acid at 0.01 to 1.0 mol/L, and phosphorous acid at 0.001 to 0.1 mol/L.

Effects of the Invention

The etching solution composition provided by the present invention can, by means of the small amount of iron ion contained therein, greatly suppress side etching in etching of a metal laminate film in which a layer formed from aluminum or an aluminum alloy as an upper part and a layer formed from titanium or a titanium alloy as a lower part are laminated.

Furthermore, the etching solution composition of the present invention has excellent etching properties that, by further addition of a pH adjusting agent or a taper angle adjusting agent, not only enable side etching to be suppressed, but also enable the occurrence of titanium residue and erosion of a glass substrate can be suppressed and the cross-sectional shape can be controlled in a range from vertical to forward taper, thereby higher precision etching to be carried out.

Moreover, in accordance with the use of such an etching solution composition, one-time etching of a metal laminate film in which a layer formed from aluminum or an aluminum alloy as an upper part and a layer formed from titanium or a titanium alloy as a lower part are laminated, which has not been possible so far, becomes possible.

MODES FOR CARRYING OUT THE INVENTION

The present invention is explained in detail below.

When iron ion comes into contact with aluminum, which has a lower oxidation-reduction potential (larger ionization tendency), the iron ion is reduced (receives an electron) and adsorbs on the surface of the aluminum, and the aluminum is oxidized (releases an electron) and dissolves. It is well known for an aluminum etching solution employing ferric chloride that trivalent iron ion has the effect of promoting dissolution of aluminum (e.g. Patent Documents 4, 5).

However, when an article to be etched is an aluminum/titanium laminate film, due to the titanium film being exposed as the aluminum film disappears a voltaic effect operates between the two metal films, etching of the titanium, which has a lower oxidation-reduction potential, is promoted, the aluminum instead receives an electron, therefore the etching rate of aluminium is degraded. Furthermore, due to the disappearance of the aluminum film, iron particles adsorbed on the surface of the aluminum film are freed, and dissolve again and return to trivalent iron ion by the action of nitric acid or hydrofluoric acid during titanium film etching and a subsequent over-etching process.

That is, by adding iron ion to the etching solution, etching of the aluminum is promoted during etching of the upper layer aluminum film, and after the titanium film is exposed etching of the aluminum can be suppressed. It is thereby possible to suppress side etching due to excessive dissolution of the aluminum, and since iron ion is dissolved again after adsorption, it can be reused as an oxidizing agent. In this way, by adding iron ion to an etching solution for an aluminum/titanium laminate film, an effect that exceeds the effect exhibited by a conventional aluminum etching solution is obtained.

Iron ion has an effect in suppressing side etching by promoting etching of aluminum during etching of the upper layer aluminum film and not being involved in etching after the lower layer titanium film is exposed. As an iron ion source, any compound, such as ferric nitrate or ferric chloride, may be used as long as it can dissociate to trivalent iron ion in a liquid, and ferric nitrate is preferable. Furthermore, the same effect of addition may be obtained when a compound that generates divalent iron ion such as ferrous nitrate or ferrous chloride is used. However, since it is thought that the initial performance of the etching solution is changed due to the effect of an oxidation-reduction reaction in which divalent iron ion is oxidized to trivalent iron ion, a trivalent iron compound is more desirable as the iron ion source.

However, when a large amount of iron ion is added, it suppresses etching of titanium and might cause extension of the etching time or the generation of titanium residue, and when too much is added etching of titanium might be stopped. Because of this, it is necessary to set the amount of iron ion added according to the various types of etching solution compositions so that it is in a range that suppresses side etching and does not cause titanium residue to be generated. The iron ion content depends on the etching solution composition but is preferably 0.0001 to 0.05 mol/L, and more preferably 0.001 to 0.03 mol/L.

With regard to the etching solution composition of the present invention, it is mainly the fluorine compound that etches aluminum or titanium. Any fluorine compound may be used, but hydrofluoric acid or ammonium fluoride is desirable. The content of the fluorine compound depends on the film thickness of the aluminum/titanium laminate film and the desired etching time, but is preferably 0.01 to 0.5 mol/L, and more preferably 0.03 to 0.3 mol/L.

The etching solution composition of the present invention may further contain a pH adjusting agent.

An aluminum/titanium laminate film that is processed by the etching solution composition of the present invention is formed on a glass substrate, and since an etching solution containing a fluorine compound releases hydrogen fluoride, the glass is eroded. In general, hydrogen fluoride dissociates in a liquid as follows.

$$HF \leftrightarrow H^+ + F^- \quad (1)$$

$$HF + F^- \leftrightarrow HF_2^- \quad (2)$$

Since the dissociation constant of hydrogen fluoride is about 3, the amounts of the chemical species on either side of formula (1) become equal at a pH of about 3 in dilute hydrofluoric acid solution, and the amount of $HF_2^-$ formed in formula (2) becomes a maximum. The chemical species that erodes glass is $HF_2^-$ (e.g. Patent Document 6), and the greater the amount of $HF_2^-$ present, the higher the etching rate for glass. Because of this, it is desirable that a pH of around 3 is avoided in order to suppress erosion of a glass substrate with a hydrogen fluoride-containing etching solution composition for an aluminum/titanium laminate film.

Furthermore, in etching of titanium, the lower the pH, the easier it is for etching to progress, and the harder it is for titanium residue to remain on the surface of the substrate when etching is completed. A preferred pH for etching of titanium is no greater than 2. The role of a pH adjusting agent is to reduce the pH of an etching solution composition so as to be strongly acidic, prepare an environment for aluminum and titanium to be easily dissolved, suppress the amount of $HF_2^-$ formed from the fluorine compound, and suppress erosion of a glass substrate.

From the above, in order to achieve a balance between suppression of titanium residue after etching an aluminum/titanium laminate film and suppression of glass substrate erosion, the pH of the etching solution composition is preferably no greater than 2, and more preferably no greater than 1.5.

Any pH adjusting agent may be used as long as it is an acid that can reduce the pH of an etching solution to no greater than 2, and preferably no greater than 1.5, without badly affecting the etching of titanium, but since an increase in liquid viscosity and cost can be suppressed if the pH can be reduced with a relatively small amount, it is desirable to use a strong acid. Among them, nitric acid, hydrochloric acid, perchloric acid, and methanesulfonic acid are preferable, nitric acid is the most preferable taking the effect of making it easy for reductively-deposited iron particles to be dissolved again into consideration, and two or more types thereof may be contained at the same time. Furthermore, when a fluorine compound, such as ammonium fluoride, that increases the pH of the etching solution is used, it is necessary to increase the content of the pH adjusting agent. The content of the pH adjusting agent is preferably a total of 0.01 to 1.0 mol/L, and more preferably a total of 0.05 to 0.5 mol/L.

In etching utilizing the etching solution composition of the present invention, due to the action of trivalent iron ion, a lower layer titanium film is exposed while side etching of an upper layer aluminum film progresses only to a small degree. Furthermore, after the titanium film is exposed the etching rate of aluminum is decreased by virtue of the voltaic effect. Because of this, if over-etching is carried out with the just-etching time for an aluminum/titanium laminate film as a reference, a reverse taper shape in which side etching of the lower layer titanium film has progressed more than the upper layer aluminum film is likely obtained.

In order to improve the above, the etching solution composition of the present invention may further contain a taper angle adjusting agent. Any taper angle adjusting agent may be used as long as it has an effect of regulating the cross-sectional shape, but phosphorous acid and phosphoric acid, which exhibit an effect in decreasing the etching rate of a titanium film without affecting the etching rate for aluminum, are preferable, and two or more types thereof may be added at the same time. Phosphorous acid is the most preferable. Due to these effects, the cross-sectional shape is adjusted by slightly increasing the etching time for a lower layer titanium film and carrying out a small degree of side etching of an upper layer aluminum film during this process. By appropriately regulating the content of these taper angle adjusting agents, it is possible to adjust the cross-sectional shape from a reverse taper shape so as to be in a range of a vertical to forward taper.

When the content of the taper angle adjusting agent is too high, the etching rate of a lower layer titanium film becomes too low, and this might cause an increase in side etching due to a longer etching time or the occurrence of titanium residue as a result of suppression of the titanium film etching. Since the content of the taper angle adjusting agent is basically limited to a very small amount, it is difficult for it to also exhibit an effect of adjusting the pH of the etching solution so as to be no greater than 2, and preferably no greater than 1.5. Because of this, it is not possible to use the same compound both as a taper angle adjusting agent and as a pH adjusting agent.

The amount of taper angle adjusting agent required depends on the content of other materials, but it is preferably a total of 0.001 to 0.1 mol/L, and more preferably 0.005 to 0.05 mol/L.

As hereinbefore described, the most preferred mode for the etching solution composition of the present invention is an etching solution composition containing hydrofluoric acid at a concentration of 0.01 to 0.5 mol/L, trivalent iron ion at 0.0001 to 0.05 mol/L, nitric acid at 0.01 to 1.0 mol/L, and phosphorous acid at 0.001 to 0.1 mol/L.

Moreover, the present invention also provides a one-time etching method employing the above-mentioned etching solution composition.

In accordance with the method of the present invention, it becomes possible to carry out high precision etching of an aluminum/titanium laminate film, for which high precision etching is conventionally difficult due to a large degree of side etching, and wiring can be formed exactly as in a resist pattern.

The etching solution composition used in the method of the present invention contains a fluorine compound and iron ion. In accordance with the use of such an etching solution composition, when an upper layer aluminum (alloy) layer is etched the etching thereof is promoted, and when a lower layer titanium layer is exposed the etching of the aluminum layer is suppressed due to the oxidation-reduction potential relationship between titanium, aluminum, and the iron ion in the etching solution composition, thus achieving a desirable degree of side etching when etching is completed. It is therefore possible to overcome a large degree of side etching, which is the conventional problem with one-time etching, and the resulting difficulty for a high precision etching process.

The etching solution composition used in the method of the present invention may further contain a pH adjusting agent. Lowering the pH promotes the progress of etching of titanium. From the viewpoint of the etching rate of a metal layer and suppression of erosion of a glass substrate, the pH is preferably no greater than 2. From the viewpoint of lowering the pH to no greater than 2 or preventing etching of titanium from being badly affected by the addition, it is preferably a strong acid, particularly preferably nitric acid, hydrochloric acid, perchloric acid, or methanesulfonic acid, and most preferably nitric acid.

The etching solution composition used in the method of the present invention may further contain a taper angle adjusting agent. Adding a taper angle adjusting agent can prevent the etching cross-section from becoming a reverse taper shape. The taper angle adjusting agent is preferably phosphoric acid, phosphorous acid, or a combination thereof, and most preferably phosphorous acid.

The etching solution composition used in the method of the present invention may contain all of the above-mentioned supplementary additives. The etching solution composition used in the method of the present invention is most preferably an etching solution composition containing hydrofluoric acid at a concentration of 0.01 to 0.5 mol/L, trivalent iron ion at 0.0001 to 0.05 mol/L, nitric acid at 0.01 to 1.0 mol/L, and phosphorous acid at 0.001 to 0.1 mol/L. The use of such an etching solution composition enables high precision one-time etching to be carried out in which the degree of side etching is suppressed, etching residue is reduced while preventing erosion of the glass substrate, and the cross-sectional shape becomes a taper shape.

With regard to the temperature at which etching of a metal laminate film is carried out with the etching solution composition of the present invention, while taking into consideration the etching rate being low at a low temperature and the time required for etching possibly becoming too long, and the etching rate being high at a high temperature and ease of control of etching being degraded, it is preferably 30° C. to 50° C.

The present invention is explained in detail below by reference to Examples and Comparative Examples, but the present invention is not limited to these examples.

EXAMPLES

Examples

After forming a titanium film (350 Å) on a glass substrate by a sputtering method, an aluminum film (2700 Å) was further formed by a sputtering method, thus preparing the substrate having laminated thereon an aluminum layer as the upper part and a titanium layer as the lower part. Subsequently, patterning was carried out on the aluminum/titanium laminate film using a resist, thus completing an aluminum/titanium laminate film substrate.

This aluminum/titanium laminate film substrate was immersed in the etching solutions shown in the Examples and Comparative Examples at a liquid temperature of 40° C. under stirring conditions for a time of 1.5 times the just-etching time, thus carrying out etching. Subsequently, a sample was washed with water and dried and then subjected to inspection by SEM, and the performance of each of the etching solutions was compared.

Etching was carried out using the compositions shown in the Table below, and the degree of side etching was compared for compositions containing ferric nitrate and compositions not containing it.

TABLE 1

| Composition | Mixing proportions (mol/L) | | | | | | Degree of side etching (μm) |
| --- | --- | --- | --- | --- | --- | --- | --- |
| | Hydrofluoric acid | Ammonium fluoride | Ferric nitrate | Nitric acid | Phosphoric acid | Phosphorous acid | |
| Comparative Example 1 | 0.07 | — | 0 | 0 | 0 | — | 1.9 |
| Comparative Example 2 | 0.07 | — | 0 | 0.16 | 0 | — | 1.2 |
| Comparative Example 3 | 0.07 | — | 0 | 0 | 0.01 | — | 1.8 |
| Comparative Example 4 | 0.07 | — | 0 | 0.16 | 0.01 | — | 1.2 |
| Composition Example 1 | 0.07 | — | 0.002 | 0 | 0 | — | 0.8 |
| Composition Example 2 | 0.07 | — | 0.002 | 0.16 | 0 | — | 0.9 |
| Composition Example 3 | 0.07 | — | 0.002 | 0 | 0.01 | — | 0.8 |
| Composition Example 4 | 0.07 | — | 0.002 | 0.16 | 0.01 | — | 0.6 |
| Composition Example 5 | 0.04 | — | 0.002 | 0.16 | — | 0.01 | 0.8 |
| Composition Example 6 | 0.07 | — | 0.002 | 0.16 | — | 0.01 | 0.7 |
| Composition Example 7 | 0.1 | — | 0.002 | 0.16 | — | 0.01 | 0.8 |
| Composition Example 8 | — | 0.04 | 0.002 | 0.25 | — | 0.01 | 0.7 |
| Composition Example 9 | — | 0.07 | 0.002 | 0.25 | — | 0.01 | 0.7 |
| Composition Example 10 | — | 0.1 | 0.002 | 0.25 | — | 0.01 | 0.6 |
| Composition Example 11 | 0.07 | — | 0.0001 | 0.2 | 0.01 | — | 0.9 |
| Composition Example 12 | 0.07 | — | 0.001 | 0.2 | 0.01 | — | 0.7 |

TABLE 1-continued

| Composition | Mixing proportions (mol/L) | | | | | | Degree of side etching (μm) |
| --- | --- | --- | --- | --- | --- | --- | --- |
| | Hydro fluoric acid | Ammonium fluoride | Ferric nitrate | Nitric acid | Phosphoric acid | Phosphorous acid | |
| Composition Example 13 | 0.07 | — | 0.01 | 0.2 | 0.01 | — | 0.8 |

As is clear from Table 1, the degree of side etching was greatly reduced by the addition of a small amount of ferric nitrate. For compositions to which ferric nitrate was not added, the degree of side etching did not become lower than 1 μm. On the other hand, for compositions to which it was added, even with the addition of a very small amount of ferric nitrate, the degree of side etching could be suppressed to less than 1 μm. Furthermore, nitric acid, which was added as a pH adjusting agent, and phosphoric acid or phosphorous acid, which were added as taper angle adjusting agents, did not greatly affect the degree of side etching.

Either when hydrofluoric acid was used as the fluorine compound or when ammonium fluoride was used, the degree of side etching was less than 1 μm, and it can be seen that the etching solution composition of the present invention can etch an aluminum/titanium laminate film substrate with high precision regardless of the type of fluorine compound.

As hereinbefore described, it can be seen that decrease in the degree of side etching is greatly affected by iron ion, and the degree of side etching can be greatly reduced even with the addition of a small amount thereof, the effect being hardly affected by the type of fluorine compound or the presence of a pH adjusting agent and a taper angle adjusting agent. Therefore, it is possible to further add a pH adjusting agent for the purpose of suppressing titanium residue and a taper angle adjusting agent for the purpose of regulating the cross-sectional shape at appropriate amounts.

Reference Example 1

In order to confirm the function of a pH adjusting agent, etching was carried out with the compositions shown in the Table below, and the presence or absence of titanium residue on the surface of a glass substrate was examined.

TABLE 2

| Composition | Mixing proportions (mol/L) | | | | Degree of side etching (μm) | Titanium residue |
| --- | --- | --- | --- | --- | --- | --- |
| | Hydro fluoric acid | Ferric nitrate | pH adjusting agent | Phosphorous acid | | |
| Composition Example 14 | 0.07 | 0.002 | — | — | 0.01 | 0.7 | Some |
| Composition Example 6 | 0.07 | 0.002 | Nitric acid | 0.16 | 0.01 | 0.7 | None |
| Composition Example 15 | 0.07 | 0.002 | Hydro chloric acid | 0.16 | 0.01 | 0.8 | None |
| Composition Example 16 | 0.07 | 0.002 | Perchloric acid | 0.16 | 0.01 | 0.8 | None |
| Composition Example 17 | 0.07 | 0.002 | Methane sulfonic acid | 0.16 | 0.01 | 0.9 | None |

As is clear from Table 2, in etching solution compositions to which a pH adjusting agent was added, regardless of which pH adjusting agent was used, titanium residue was not observed.

Reference Example 2

In order to confirm the function of a taper angle adjusting agent, etching was carried out with the compositions shown in the Table below, and the cross-sectional shape of a pattern edge part was examined.

TABLE 3

| Composition | Mixing proportions (mol/L) | | | | Degree of side etching (μm) | Cross-sectional shape |
| --- | --- | --- | --- | --- | --- | --- |
| | Hydro fluoric acid | Ferric nitrate | Nitric acid | Taper angle adjusting agent | | |
| Composition Example 18 | 0.07 | 0.005 | 0.15 | — | — | 1.0 | Reverse taper |

TABLE 3-continued

| | Mixing proportions (mol/L) | | | | | Degree of side etching (μm) | Cross-sectional shape |
|---|---|---|---|---|---|---|---|
| Composition | Hydro fluoric acid | Ferric nitrate | Nitric acid | Taper angle adjusting agent | | | |
| Composition Example 19 | 0.07 | 0.005 | 0.15 | Phosphorous acid | 0.01 | 0.6 | Vertical |
| Composition Example 20 | 0.07 | 0.005 | 0.15 | Phosphorous acid | 0.05 | 0.8 | Taper |
| Composition Example 21 | 0.07 | 0.005 | 0.15 | Phosphoric acid | 0.01 | 0.9 | Vertical |
| Composition Example 22 | 0.07 | 0.005 | 0.15 | Phosphoric acid | 0.05 | 0.7 | Taper |

As is clear from Table 3, by adding iron ion, the cross-sectional shape tends to become a reverse taper shape, but in etching solution compositions to which a taper angle adjusting agent was added, a vertical or taper cross-sectional shape was observed.

INDUSTRIAL APPLICABILITY

The present invention can be used as an etching solution composition for a metal laminate film that is used for formation of gate, source, and drain electrodes of a liquid crystal display.

The invention claimed is:

1. A method for one-time etching a metal laminate film in which a layer formed from aluminum or an aluminum alloy as an upper part and a layer formed from titanium or a titanium alloy as a lower part are laminated and which is formed on a glass substrate, the method using an etching solution composition comprising a fluorine compound and an iron ion, wherein a part of the layer formed from aluminum or an aluminum alloy is etched to expose the layer formed from titanium or a titanium alloy in the etching.

2. The method according to claim 1, wherein the etching solution composition has a pH of no greater than 2.

3. The method according to claim 1, wherein the etching solution composition comprises a fluorine compound at a concentration of 0.01 to 0.5 mol/L and an iron ion at 0.0001 to 0.05 mol/L.

4. The method according to claim 1, wherein the etching solution composition further comprises one or more types selected from the group consisting of nitric acid, hydrochloric acid, perchloric acid, and methanesulfonic acid.

5. The method according to claim 4, wherein the etching solution composition comprises one or more types selected from the group consisting of nitric acid, hydrochloric acid, perchloric acid, and methanesulfonic acid at a total concentration of 0.01 to 1.0 mol/L.

6. The method according to claim 1, wherein the etching solution composition further comprises phosphorous acid and/or phosphoric acid.

7. The method according to claim 6, wherein the etching solution composition comprises phosphorous acid and/or phosphoric acid at a total concentration of 0.001 to 0.1 mol/L.

8. A method for one-time etching a metal laminate film in which a layer formed from aluminum or an aluminum alloy as an upper part and a layer formed from titanium or a titanium alloy as a lower part are laminated and which is formed on a glass substrate, the method using an etching solution composition comprising hydrofluoric acid at a concentration of 0.01 to 0.5 mol/L, trivalent iron ion at 0.0001 to 0.05 mol/L, nitric acid at 0.01 to 1.0 mol/L, and phosphorous acid at 0.001 to 0.1 mol/L.

* * * * *